United States Patent
Itoga et al.

(10) Patent No.: US 7,310,274 B2
(45) Date of Patent: Dec. 18, 2007

(54) SEMICONDUCTOR DEVICE

(75) Inventors: Naoko Itoga, Yokohama (JP); Hitoshi Iwai, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 415 days.

(21) Appl. No.: 11/069,954

(22) Filed: Mar. 3, 2005

(65) Prior Publication Data

US 2006/0090107 A1    Apr. 27, 2006

(30) Foreign Application Priority Data

Oct. 21, 2004    (JP) .............................. 2004-307046

(51) Int. Cl.
  *G11C 11/34* (2006.01)
(52) U.S. Cl. ................... 365/189.04; 365/201
(58) Field of Classification Search ........... 365/189.04, 365/201
  See application file for complete search history.

(56) References Cited

U.S. PATENT DOCUMENTS

2003/0002361 A1* 1/2003 Fischer et al. .............. 365/200
2003/0107926 A1* 6/2003 Ohmura et al. ............. 365/200
2004/0085825 A1* 5/2004 Narita et al. ................ 365/200
2004/0218431 A1* 11/2004 Chung et al. ............... 365/200
2005/0002243 A1* 1/2005 Mohr et al. ................. 365/200

FOREIGN PATENT DOCUMENTS

| JP | 7-70240 | 3/1995 |
| JP | 11-203893 | 7/1999 |
| JP | 2001-118397 | 4/2001 |
| JP | 2001-236798 | 8/2001 |
| JP | 2002-157900 | 5/2002 |
| JP | 2002-260400 | 9/2002 |

* cited by examiner

*Primary Examiner*—Michael T Tran
(74) *Attorney, Agent, or Firm*—Oblon, Spivak, McClelland, Maier & Neustadt, P.C.

(57) ABSTRACT

A semiconductor device includes a first memory block having a first address space, a second memory block having a second address space which is smaller than the first address space, and a test circuit which supplies a test address and a test control signal to the first memory block and the second memory block, and tests the first memory block and the second memory block simultaneously. The second memory block has a storage circuit which stores an address corresponding to the second address space, and a control circuit which inactivates the test control signal when the test address falls outside the second address space.

5 Claims, 10 Drawing Sheets

| Control signal | | Operation |
| --- | --- | --- |
| T20 | T21 | |
| 0 | 0 | Normal operation |
| 0 | 1 | Activation of dummy word lines |
| 1 | 0 | Refresh operation |
| 1 | 1 | Inactivation of all commands |

SEMICONDUCTOR DEVICE

CROSS-REFERENCE TO RELATED APPLICATIONS

This application is based upon and claims the benefit of priority from prior Japanese Patent Application No. 2004-307046, filed Oct. 21, 2004, the entire contents of which are incorporated herein by reference.

BACKGROUND OF THE INVENTION

1. Field of the Invention

The present invention relates to a semiconductor device and, more particularly, to a semiconductor device having a test circuit to conduct tests on memories.

2. Description of the Related Art

A system that is formed by integrating memories and logics on a single semiconductor chip, such as a so-called system LSI (large scale integrated circuit) is known. In the system LSI, a plurality of function blocks (cores or macros) such as memory and logic circuits are provided on a semiconductor chip. Another system LSI having a DRAM (dynamic random access memory) macro using a DRAM as a memory (referred to as an embedded DRAM hereinafter) has been developed. The DRAM macro represents a block that functions as a memory and includes a memory cell array, a decoding circuit and a sense amplification circuit.

The embedded DRAM usually has several tens of bits to hundred and several tens of bits as the width of a bus in the semiconductor chip. To test the embedded DRAM, test data output from the embedded DRAM is minimized by a test circuit because no test environment is adapted to the embedded DRAM even though the test data is output from the DRAM through pads corresponding to the bus width or the DRAM has no space enough to arrange such a large number of pads.

If an embedded DRAM has one DRAM macro whose internal bus is 128-bit wide, it is not favorable for the chip area or the test environment as described above in order to output 128-bit test data to the outside. The bit width of input/output (I/O) data is therefore converted to 8 bits through a test circuit.

In the above case, a 16-bit internal bus is assigned to one I/O. In data write mode, test input data written by a tester or the like is converted in serial-parallel by the test circuit. In data read mode, test output data read out of the DRAM macro is converted in parallel-serial by the test circuit. In other words, a plurality of internal buses are connected in parallel to a single I/O.

In order to test an embedded DRAM having a plurality of DRAM macros, test data is written to/read from the DRAM macros at the same time. Test time can be shortened accordingly.

In an embedded DRAM having two DRAM macros that differ in address space, the DRAM macros cannot be tested simultaneously under the same conditions. For example, when the row address space and column address space of a first DRAM macro are both larger than those of a second DRAM macro, the entire address space of the second DRAM macro is completely accessed before that of the first DRAM macro is completely done. In this case, the first and second DRAM macros will vary in mismatch such as refresh time intervals and in conditions of electrical stress on the macros.

When the first and second DRAM macros are tested at the same time, if the space of the row address of the second DRAM macro is half that of the row address of the first DRAM macro, the test time of the second DRAM macro will be half that of the first DRAM macro. The second DRAM macro is not accessed before the test of the first DRAM macro is completed but caused to pause. This pause is not caused in the first DRAM macro.

While the bit lines of the first DRAM macro subject to electrical stress, those of the second DRAM macro does not subject thereto. In a multi-macro product having macros that differ in address space, data cannot simultaneously be written to or read from the macros.

As related art, a method of testing a plurality of memory cores simultaneously is disclosed (see Jpn. Pat. Appln. KOKAI Publication No. 2002-157900).

BRIEF SUMMARY OF THE INVENTION

A semiconductor device according to a first aspect of the present invention, comprises a first memory block having a first address space, a second memory block having a second address space which is smaller than the first address space, and a test circuit which supplies a test address and a test control signal to the first memory block and the second memory block, and tests the first memory block and the second memory block simultaneously, wherein the second memory block includes a storage circuit which stores an address corresponding to the second address space, and a control circuit which inactivates the test control signal when the test address falls outside the second address space.

A semiconductor device according to a second aspect of the present invention, comprises a first memory block having a first address space, a second memory block having a second address space which is smaller than the first address space, and a test circuit which supplies a test address and a test control signal to the first memory block and the second memory block, and tests the first memory block and the second memory block simultaneously, wherein the test circuit includes a storage circuit which stores an address corresponding to the second address space, and a control circuit which inactivates the test control signal when the test address falls outside the second address space.

A semiconductor device according to a third aspect of the present invention, comprises a first memory block including a plurality of first memory cells, a plurality of first bit line pairs connected to the first memory cells, and a plurality of first word lines connected to the first memory cells, the first memory block having a first address space, a second memory block including a plurality of second memory cells, a plurality of second bit line pairs connected to the second memory cells, and a plurality of second word lines connected to the second memory cells, the second memory block having a second address space which is smaller than the first address space, a plurality of first dummy transistors connected in series between one bit line of each of the second bit line pairs and a ground potential, a plurality of second dummy transistors connected in series between another bit line of each of the second bit line pairs and the ground potential, a first dummy word line connected to a gate electrode of each of the first dummy transistors, a second dummy word line connected to a gate electrode of each of the second dummy transistors, and a test circuit supplies a test address and a test control signal to the first memory block and the second memory block, and tests the first memory blocks and the second memory blocks simultaneously, the test address including a first test address to select the first bit line pairs and the second bit line pairs and a second test address to select the first word lines and the second word lines, wherein the second memory block includes a storage circuit which stores an address corresponding to the second address space, and a control circuit which activates one of the first dummy word line and the second dummy word line when the second test address falls outside the second address space.

DETAILED DESCRIPTION OF THE INVENTION

Embodiments of the present invention will be described with reference to the accompanying drawings. The components having the same function or configuration are denoted by the same reference numerals and their descriptions are repeated only when the need arises.

FIRST EMBODIMENT

Figure 1:
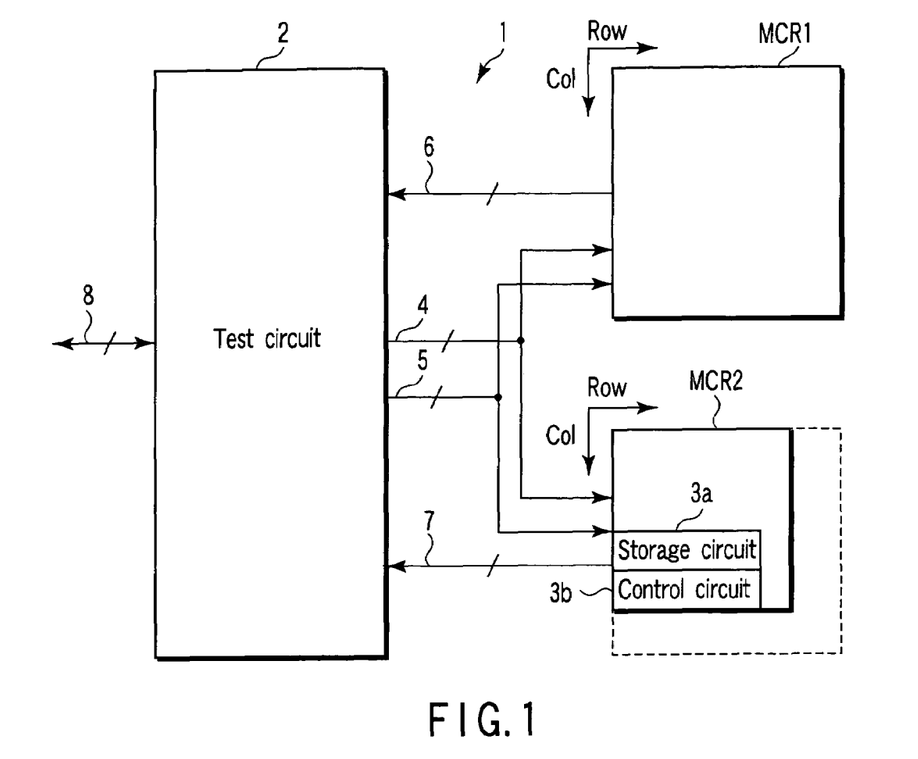
FIG. 1 is a block diagram showing a configuration of a semiconductor device 1 according to a first embodiment of the present invention.

FIG. 1 is a block diagram showing a configuration of a semiconductor device 1 according to a first embodiment of the present invention. The semiconductor device 1 includes a test circuit 2 and memory macros. MCR1 and MCR2. More specifically, the semiconductor device 1 is configured by a semiconductor integrated circuit in which the test circuit 2 and memory macros MCR1 and MCR2 are mounted on the same substrate.

The test circuit 2 and the memory macros MCR1 and MCR2 are connected to each other by a common address/command line 4. The test circuit 2 sends a test address and a command to the memory macros MCR1 and MCR2 through the address/command line 4. The test address includes a test row address that selects a cell in the row direction and a test column address that selects a cell in the column direction.

The test circuit 2 and the memory macros MCR1 and MCR2 are also connected to each other by a common write data line 5. The test circuit 2 sends test input data to the memory macros MCR1 and MCR2 through the write data line 5. For example, the write data line 5 is formed of a bus having a 128-bit width.

The test circuit 2 and the memory macro MCR1 are connected to each other by a read data line 6. The memory macro MCR1 sends test output data to the test circuit 2 through the read data line 6. The test circuit 2 and the memory macro MCR2 are connected to each other by a read data line 7. The memory macro MCR2 sends test output data to the test circuit 2 through the read data line 7. For example, the read data lines 6 and 7 are each formed of a bus having a 128-bit width.

The test circuit 2 is connected to an external circuit (not shown) by an input/output data line 8. The external circuit inputs test input data to the test circuit 2 through the data line 8, while the test circuit 2 outputs test output data to the external circuit through the data line 8. The test input data can be generated from the test circuit 2. For example, the input/output data line 8 is formed of a bus having an 8-bit width.

The memory macros MCR1 and MCR2 differ in address space from each other. Specifically, the space of each of the row and column addresses in the memory macro MCR1 is larger than that in the memory macro MCR2. The address space represents a memory area and corresponds to the number of row addresses (the number of word lines) and the number of column addresses (the number of bit lines).

FIG. 1 shows two memory macros. The number of memory macros is not limited to two, but the semiconductor device 1 may have a plurality of memory macros. Of these memory macros, the memory macro MCR1 having a largest row and column address space and the memory macro MCR2 whose address space is smaller than that of the memory macro MCR1 are taken as an example in the first embodiment.

Figure 2:
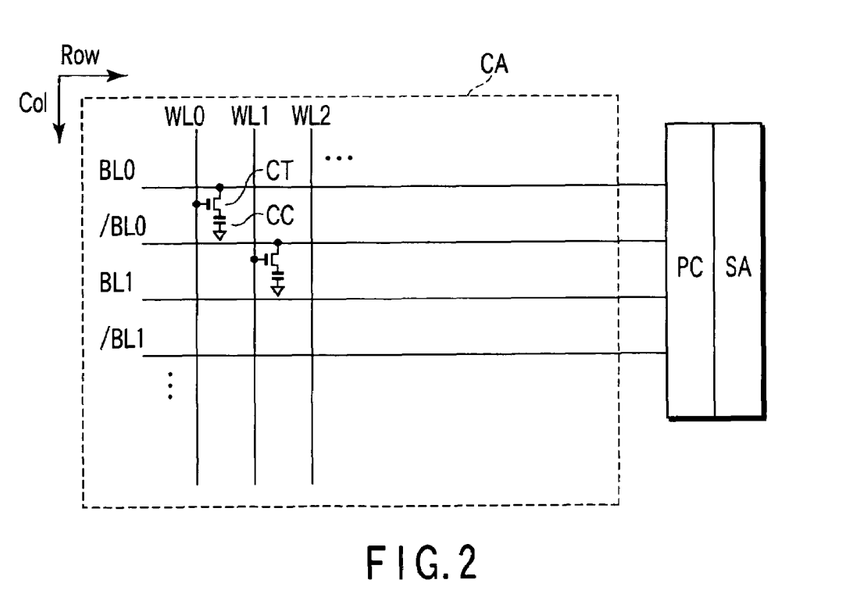
FIG. 2 is a circuit block diagram showing an arrangement of a cell array of a memory macro MCR2 in the semiconductor device shown in FIG. 1.

Each of the memory macros MCR1 and MCR2 has a cell array CA. The cell array CA is configured by, for example, a plurality of DRAM cells arranged in matrix. FIG. 2 is a circuit block diagram showing a configuration of the cell array CA of the memory macro MCR2 and its peripheral circuits.

The memory macro MCR2 includes a plurality of bit lines BL and a plurality of word lines WL. The bit lines BL are arranged in sequence in the column direction (Col). The word lines WL are arranged in sequence in the row direction (Row). DRAM cells are provided at the intersections of the bit lines BL and word lines WL. Each of the DRAM cells has a cell transistor CT and a cell capacitor CC. One electrode of the cell capacitor CC is connected to a ground potential Vss.

The cell array CA is connected to a precharge circuit PC and a sense amplification circuit SA. The precharge circuit PC charges a bit line pair with a given potential (e.g., a charge that is half the power supply voltage Vdd) when it receives a bank precharge command BP (described later) from the test circuit 2. The sense amplification circuit SA amplifies data of the bit line pair. The cell array and its peripheral circuits of the memory macro MCR1 have the same configuration as those of the memory macro MCR2, except for the number of bit lines and the number of word lines.

Referring to FIG. 1, the memory macro MR2 includes a storage circuit 3a and a control circuit 3b. The storage circuit 3a stores a memory capacity of the memory macro MCR2, or an address space. Specifically, the storage circuit 3a stores a column address for selecting a bit line and a row address for selecting a word line.

Figure 3:
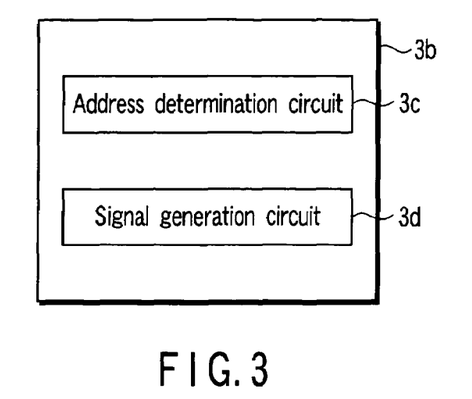
FIG. 3 is a block diagram showing an arrangement of a control circuit 3b in the semiconductor device shown in FIG. 1.

The control circuit 3b controls a command sent from the test circuit 2 when the test circuit 2 addresses an area larger than the address space stored in the storage circuit 3a. FIG. 3 is a block diagram showing an arrangement of the control circuit 3b.

The control circuit 3b includes an address determination circuit 3c and a signal generation circuit 3d. The address determination circuit 3c determines whether a test row address falls outside the address space stored in the storage circuit 3a. The circuit 3c also determines whether a test column address falls outside the address space stored in the storage circuit 3a.

The signal generation circuit 3d generates a command to control the memory macro MCR2 (specifically the cell array CA, precharge circuit PC and sense amplification circuit SA) based on the determination results of the address determination circuit 3c.

The test circuit 2 controls a test operation using a command (including a write command WT, a read command RD, a bank active command BA, and a bank precharge command BP). The write command WT is a command to send test input data to the memory macros MCR1 and MCR2. The read command RD is a command to read test output data out of the memory macros MCR1 and MCR2.

The bank active command BA is a command to activate one of banks of each of the memory macros. The bank precharge command BP is a command to charge the bit lines of a bank with a given potential (e.g., a voltage that is half the power supply voltage Vdd). Each of the memory macros MCR1 and MCR2 can be divided into a plurality of banks or configured by a single bank.

The test circuit 2 writes test input data, which is supplied from, e.g., the external circuit, to the memory macros MCR1 and MCR2. The test circuit 2 reads test output data from the memory macros MCR1 and MCR2. The test circuit 2 supplies the test output data to the external circuit through the data line 8.

The test circuit 2 converts the test output data into, e.g., 8-bit data. If an internal bus is 128-bit wide, sixteen internal buses are assigned to one data line 8. In data write mode, the test circuit 2 converts the test input data in serial-parallel. In data read mode, the test circuit 2 converts the test output data in parallel-serial. In other words, a plurality of internal buses are connected in parallel to one data line 8.

The test circuit 2 can operate in two scan modes of a column-first scan mode (in which a column address is scanned first in the column direction and then a row address is incremented) and a row-first scan mode (in which a row address is scanned first in the row direction and then a column address is incremented). These modes can arbitrarily be selected according to the type of a test or the like.

A method of testing a memory macro will now be described. There are a multi-write mode and a multi-read mode to test a memory macro in a short time. In the multi-write mode, write time can be shortened by writing data simultaneously to the internal buses connected to each I/O.

In the multi-read mode, the test circuit 2 compiles the test output data read from a memory macro for each I/O and then supplies it outside the semiconductor device 1, or it compares the test output data and outputs the results of the comparison. In the multi-read mode, there is limitation that the internal buses connected to each I/O should have the same data.

If the internal bus is 128-bit wide and the input/output data line 8 is 8-bit wide as described above, the number of internal buses connected in parallel to one input/output data line 8 is sixteen. Write time in the multi-write mode is one sixteenth that in a normal test and so is read time in the multi-read mode.

A DRAM mass-production test includes a test for replacing a defective cell with a defect-free one using a redundant circuit (this replacement is referred to as redundancy hereinafter) and reliving as a perfect device, and a test for detecting a defective cell after the redundancy and sorting a defective device out. The former test is referred to as a pre-fuse test, while the latter test is referred to as a post-fuse test.

The pre-fuse test requires address information of a cell that is considered to be defective in the test for memory macros since the defective cell needs to be replaced as described above. On the other hand, the post-fuse test has only to require simple pass/fail information of memory macros. In the pre-fuse test, not the multi-read mode, but only the multi-write mode can be used, because the test circuit 2 compiles the test output data read from a memory macro for each I/O in the multi-read mode.

In the post-fuse test, both the multi-write and multi-read modes can be used. In the first embodiment, the test circuit 2 can operate in both the multi-write and multi-read modes.

The test circuit 2 tests a plurality of memory macros at the same time. More specifically, the test circuit 2 supplies each of the memory macros with a test address corresponding to a memory macro having the largest address space (memory macro MCR1 in the first embodiment). If a memory macro has a 128-bit internal bus and the input/output data line 8 is 8 bit wide, sixteen internal buses are connected in parallel to the data line 8.

When the test circuit 2 tests two memory macros at the same time, thirty-two internal buses of two memory macros are connected to the one-bit data line 8. In other words, it can be considered that the number of internal buses connected to each data line 8 increases to thirty-two from sixteen in a semiconductor device having one memory macro. Test time can be shortened to one thirty-second the normal test time.

Figure 4:
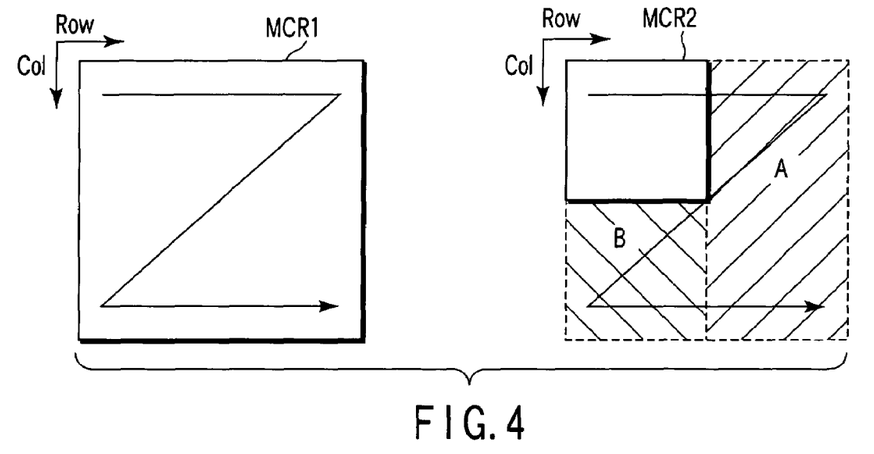
FIG. 4 is an illustration of operations of the memory macros MCR1 and MCR2 in row-first scan mode.

An operation of the semiconductor device 1 so configured will be described. FIG. 4 is an illustration of an operation of the memory macros MCR1 and MCR2 in row-first scan mode. The arrows in FIG. 4 indicate the directions of scanning.

First, the test circuit 2 scans row addresses in the row direction. After the test circuit 2 scans the last row address, it increments a column address. In the incremented column address, the test circuit 2 scans row addresses in the row direction. After the test circuit 2 scans the last row address, it increments a column address again. The test circuit 2 repeats these operations until the scanning of row addresses in the last column address is completed, thereby scanning the address spaces of the memory macros MCR1 and MCR2.

The test circuit 2 conducts the same test on the memory macros MCR1 and MCR2 at the same time as described above. In other words, the test circuit 2 sends the same test address and the same command to the memory macros MCR1 and MCR2.

When the test circuit 2 addresses the address space of the memory macro MCR2, the control circuit 3b causes the memory macro MCR2 to execute a command sent from the test circuit 2. The control circuit 3b does not convert the command.

While the test circuit 2 is addressing an area A (in which the test row address falls outside the address space), the control circuit 3b inactivates all the commands output from the test circuit 2. The control circuit 3b supplies the memory macro MCR2 with none of the commands output from the test circuit 2. The addressing of the area having no memory cells in the row direction can thus be stopped. Specifically, an operation of writing test input data to the area A can be stopped, as can be that of reading test input data from the area A.

While the test circuit 2 is addressing an area B (in which the test row address does not fall outside the address space but the test column address falls outside the address space), the control circuit 3b refreshes (rewrites) data stored in memory cells corresponding to the test row address. The control circuit 3b supplies the memory macro MCR2 with the command BA/BP output from the test circuit 2 and inactivates the command WT/RD. Thus, the control circuit 3b refreshes the data stored in the memory cells connected to a selected word line.

More specifically, when the precharge circuit PC receives a command BP, it charges a corresponding bit line with a precharge potential. If a corresponding word line is activated, stored data is transferred to the bit line from the memory cells. The transferred data is sensed and amplified by the sense amplification circuit SA and the amplified data is stored again in the memory cells.

The control circuit 3b can inactivate all the commands output from the test circuit 2 while the test circuit 2 is addressing the area B.

Figure 5:
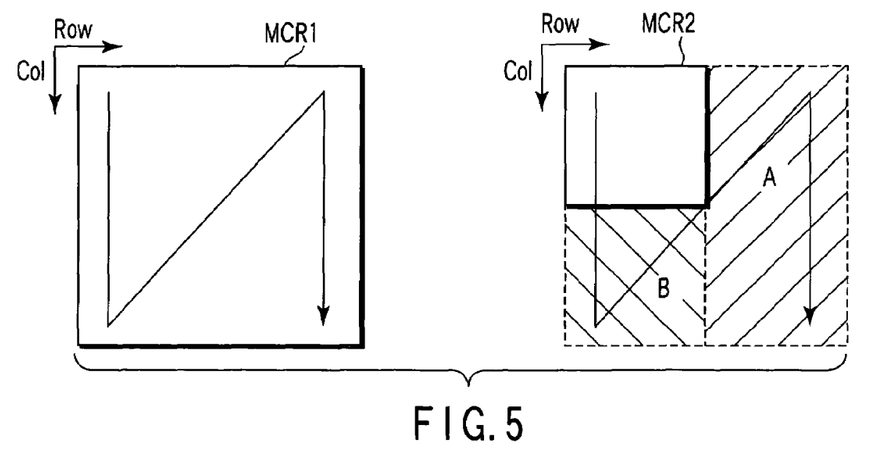
FIG. 5 is an illustration of operations of the memory macros MCR1 and MCR2 in column-first scan mode.

FIG. 5 is an illustration of an operation of the memory macros MCR1 and MCR2 in column-first scan mode. The arrows in FIG. 5 indicate the direction of scanning. First, the test circuit 2 scans column addresses in the column direction. After the test circuit 2 scans the last column address, it increments a row address.

In the column-first scan mode, too, the test circuit 2 conducts the same test on the memory macros MCR1 and MCR2 at the same time. In other words, the test circuit 2 sends the same test address and the same command to the memory macros MCR1 and MCR2.

In FIG. 5, while the test circuit 2 is addressing an area A, the control circuit 3b inactivates all the commands output from the test circuit 2. While the test circuit 2 is addressing an area B, the control circuit 3b refreshes the data stored in the memory cells corresponding to the area B.

Figure 6:
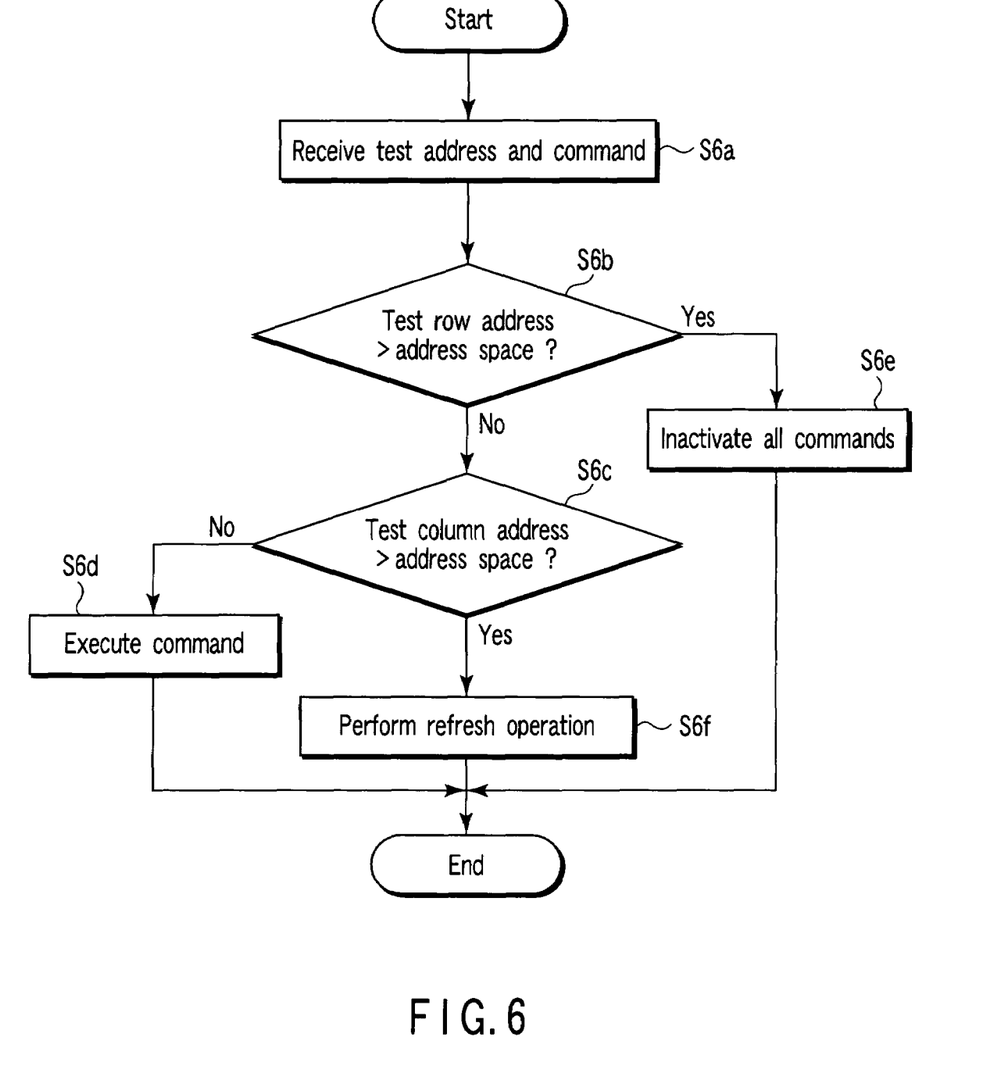
FIG. 6 is a flowchart showing an operation of the control circuit 3b of the memory macro MCR2 shown in FIG. 3.

FIG. 6 is a flowchart showing an operation of the control circuit 3b of the memory macro MCR2. In order to test the memory macros MCR1 and MCR2, the test circuit 2 generates a command and a test address and sends them to the memory macros MCR1 and MCR2.

The control circuit 3b receives a command and a test address from the test circuit 2 (step S6a). Then, the address determination circuit 3c compares a test row address with the address space stored in the storage circuit 3a (step S6b). If the address determination circuit 3c determines that the test row address does not fall outside the address space, it compares a test column address with the address space stored in the storage circuit 3a (step S6c).

If the circuit 3c determines that the test column address does not fall outside the address space, the signal generation circuit 3d causes the memory macro MCR2 (specifically, the cell array CA, precharge circuit PC and sense amplification circuit SA) to conduct a test based on the commands output from the test circuit 2 (step S6d). The signal generation circuit 3d supplies the memory macro MCR2 with the commands output from the test circuit 2.

If the address determination circuit 3c determines that the test row address falls outside the address space in step S6b, the signal generation circuit 3d inactivates all the commands output from the test circuit 2 (step S6e). The addressing of the area having no memory cells in the row direction can thus be stopped.

If the address determination circuit 3c determines that the test column address falls outside the address space in step S6c, the signal generation circuit 3d performs a refresh operation (step S6f). The signal generation circuit 3d supplies the memory macro MCR2 with the command BA/BP output from the test circuit 2 and inactivates the command WT/RD. Thus, the signal generation circuit 3d refreshes the data stored in the memory cells connected to a selected word line.

As described above, the test circuit 2 tests the memory macros MCR1 and MCR2 having different address spaces at the same time. If the test row address falls outside the address space of the memory macro MCR2, the signal generation circuit 3d inactivates all the commands. If the test row address is does not fall outside the address space but the test column address falls outside the address space, the signal generation circuit 3d refreshes the stored data.

In the first embodiment, the commands can be controlled in accordance with the size of each of the memory macros. A memory macro having a large row/column configuration and a memory macro having a small row/column configuration can thus be tested at the same time.

The same stress as the electrical stress on the memory macro MCR1 can be applied to the memory macro MCR2. During the test, the same compensation as that for the memory macro MCR1 can be provided for the memory macro MCR2.

The address/command line 4 and write data line 5 are each common to the memory macros. No additional wiring for supplying addresses and commands is required for each of the memory macros. Using the existing test circuit 2, the memory macros MCR1 and MCR2 having different address spaces can be tested at the same time.

The data stored in the memory cells of the memory macro MCR2 can be refreshed.

SECOND EMBODIMENT

Figure 7:
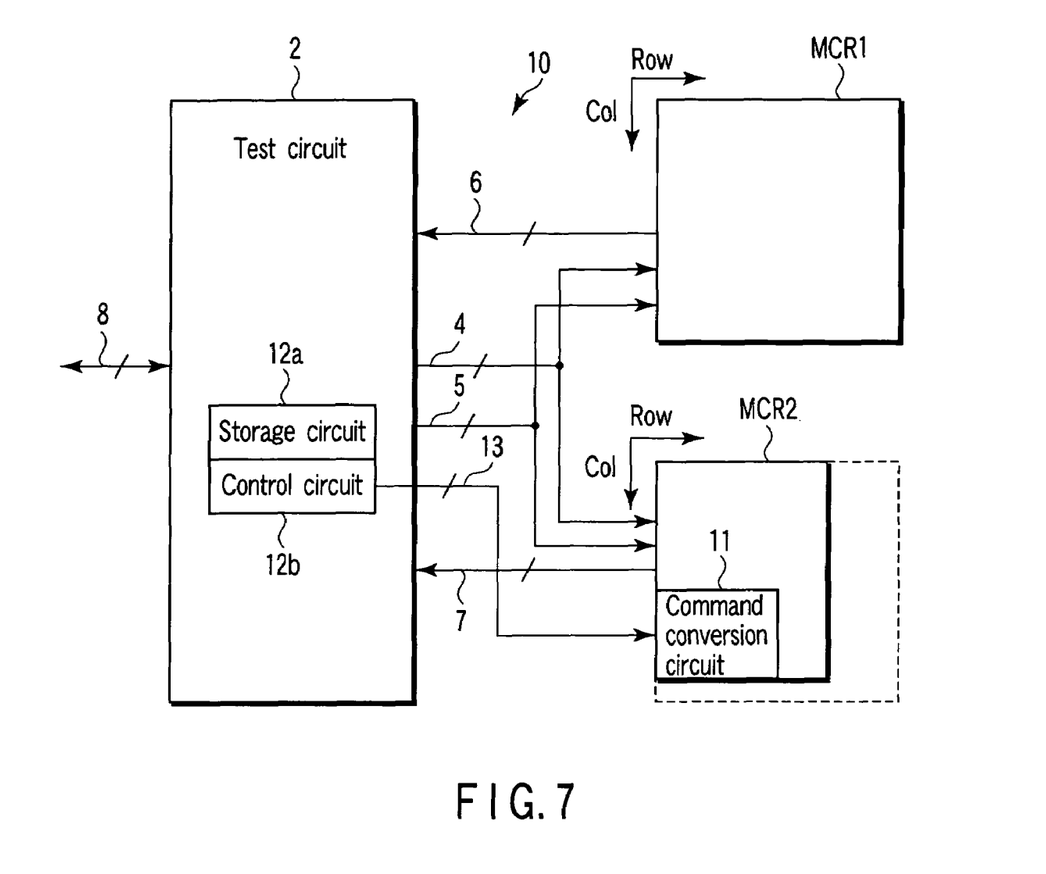
FIG. 7 is a block diagram showing a configuration of a semiconductor device 10 according to a second embodiment of the present invention.

In the second embodiment of the present invention, a test circuit 2 stores an address space of a memory macro MCR2 and controls commands supplied to the memory macro MCR2.

FIG. 7 is a block diagram showing a configuration of a semiconductor device 10 according to a second embodiment of the present invention. The test circuit 2 includes a storage circuit 12a and a control circuit 12b. The storage circuit 12a stores a memory capacity of the memory macro MCR2, or an address space. Specifically, the storage circuit 12a stores a column address for selecting a bit line and a row address for selecting a word line.

The control circuit 12b generates a control signal for converting a command when the test circuit 2 addresses an area larger than the address space stored in the storage circuit 12a. Then, the control circuit 12b supplies the control signal to the memory macro MCR2.

Figure 8:
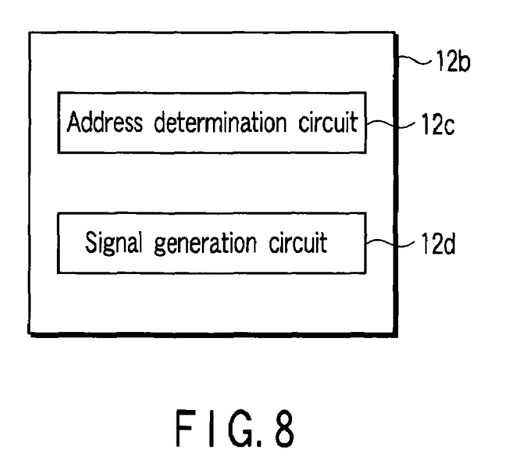
FIG. 8 is a block diagram showing an arrangement of a control circuit 12b in the semiconductor device 10 shown in FIG. 7.

FIG. 8 is a block diagram showing a configuration of the control circuit 12b shown in FIG. 7.

The control circuit 12b includes an address determination circuit 12c and a signal generation circuit 12d. The address determination circuit 12c determines whether a test row address falls outside the address space stored in the storage circuit 12a. The circuit 12c also determines whether a test column address falls outside the address space stored in the storage circuit 12a.

The signal generation circuit 12d generates control signals T1 and T2 to control the memory macro MCR2 (specifically the cell array CA, precharge circuit PC and sense amplification circuit SA) based on the determination results of the address determination circuit 12c.

The memory macro MCR2 includes a command conversion circuit 11. The command conversion circuit 11 converts a command based on the control signals T1 and T2 supplied from the test circuit 2. The circuit 11 supplies the command to the memory macro MCR2.

The test circuit 2 and memory macro MCR2 are connected by a control signal line 13. The control signals are sent from the test circuit 2 to the memory macro MCR2 through the control signal line 13.

The test circuit 2 is the same as that of the first embodiment, except that it includes the storage circuit 12a and control circuit 12b. In other words, the test circuit 2 of the second embodiment supplies the memory macros MCR1 and MCR2 with a test address and a command (including write command WT, read command RD, bank active command BA and bank precharge command BP).

Figure 9:
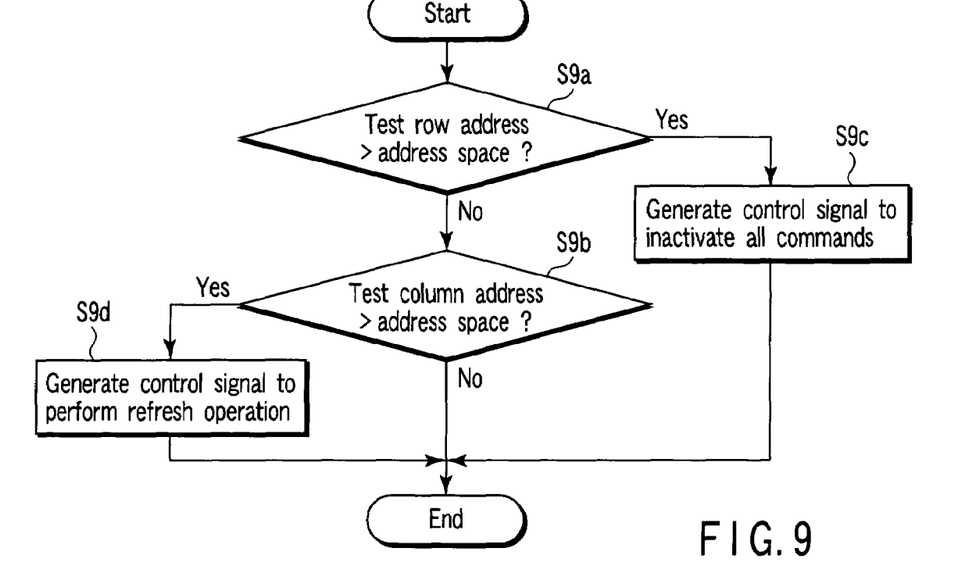
FIG. 9 is a flowchart showing an operation of the control circuit 12b shown in FIG. 8.

An operation of the semiconductor device 10 so configured will be described. FIG. 9 is a flowchart showing an operation of the control circuit 12b of the test circuit 2.

The test circuit 2 generates a command for testing the memory macros MCR1 and MCR2 and sends it to them. Then, the test circuit 2 generates a test address and sends it to them.

The address determination circuit 12c compares a test row address with the address space of the memory macro MCR2 stored in the storage circuit 12a (step S9a). If the circuit 12c determines that the test row address does not fall outside the address space, it compares a test column address with the address space (step S9b).

If the circuit 12c determines that the test column address does not fall outside the address space in step S9b, the signal generation circuit 12d causes the memory macro MCR2 to execute a normal command. In other words, the circuit 12d does not supply the memory macro MCR2 with a control signal for converting a command.

If the circuit 12c determines that the test row address falls outside the address space in step S9a, the signal generation circuit 12d generates a control signal T1 for inactivating all the commands (step S9c). The control signal T1 is sent to the memory macro MCR2.

If the circuit 12c determines that the test column address falls outside the address space in step S9b, the signal generation circuit 12d generates a control signal T2 for refreshing data of the memory macro MCR2 (step S9d). The control signal T2 is sent to the memory macro MCR2.

The command conversion circuit 11 of the memory macro MCR2 converts a command based on the control signal T1 or T2. Upon receiving the control signal T1, the circuit 11 inactivates all of commands WT, RD, BA and BP supplied from the test circuit 2. Upon receiving the control signal T2, it supplies commands BA and BP, which are sent from the test circuit 2, to the memory macro MCR2 as they are and inactivates commands WT and RD. When the command conversion circuit 11 is supplied with neither of control signals T1 and T2, it supplies the commands, which are sent from the test circuit 2, to the memory macro MCR2 as they are.

According to the second embodiment, as described in detail above, the commands can be controlled in accordance with the size of each of the memory macros. A memory macro having a large row/column configuration and a memory macro having a small row/column configuration can thus be tested at the same time.

The same stress as the electrical stress on the memory macro MCR1 can be applied to the memory macro MCR2. During the test, the same compensation as that for the memory macro MCR1 can be provided for the memory macro MCR2.

The data stored in the memory cells of the memory macro MCR2 can be refreshed. The second embodiment is effective in preventing the memory macro MCR2 from increasing in circuit area.

Since the memory macro MCR2 is controlled by the control signals T1 and T2, the test circuit 2 has only to conduct normal tests on the memory macros MCR1 and MCR2. In other words, the test circuit 2 has only to supply the same command and the same address to the memory macros MCR1 and MCR2, except for the control signals T1 and T2. Thus, the existing test circuit can be used as it is.

In the second embodiment, the test circuit 2 controls the operation of the memory macro MCR2 by the control signals T1 and T2. However, the test circuit 2 can supply a command directly to the MCR2 to control the operation of the memory macro MCR2. In this case, too, the same advantages as those of the second embodiment can be obtained.

THIRD EMBODIMENT

In the third embodiment of the present invention, a memory macro MCR2 has dummy word lines. When a test row address falls outside the address space of the memory macro MCR2, the dummy word lines are activated.

Figure 10:
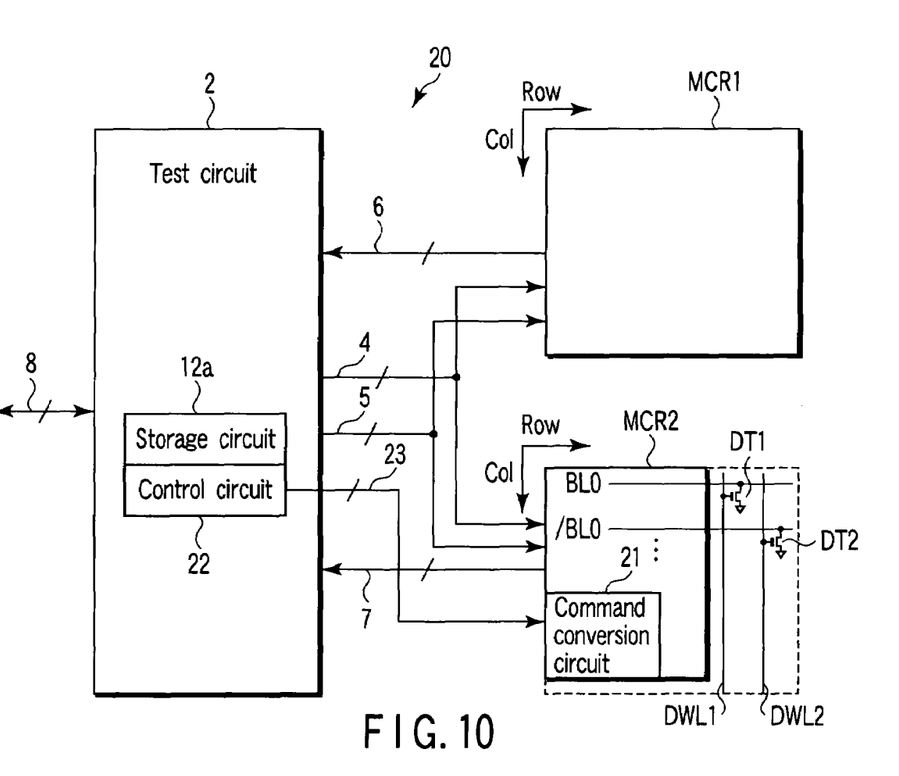
FIG. 10 is a block diagram showing a configuration of a semiconductor device 20 according to a third embodiment of the present invention.

FIG. 10 is a block diagram showing a configuration of a semiconductor device 20 according to a third embodiment of the present invention. The semiconductor device 20 includes a test circuit 2. The test circuit 2 has a storage circuit 12a and a control circuit 22. The storage circuit 12a stores the address space of the memory macro MCR2.

Figure 11:
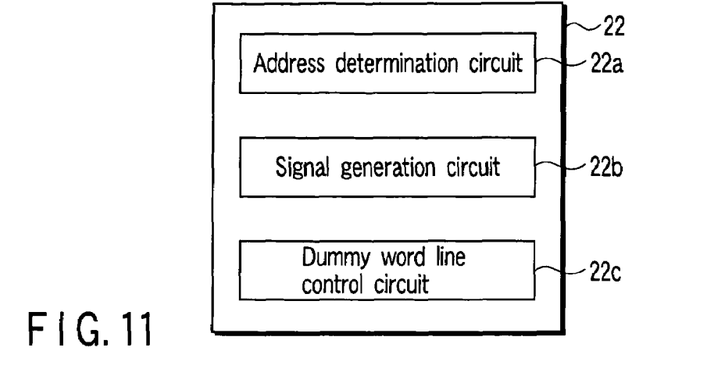
FIG. 11 is a block diagram showing an arrangement of a control circuit 22 in the semiconductor device 20 shown in FIG. 10.

When the test circuit 2 addresses an area larger than the address space stored in the storage circuit 12a, the control circuit 22 generates a control signal for converting a command. The control circuit 22 supplies the control signal to the memory macro MCR2. FIG. 11 is a block diagram showing a configuration of the control circuit 22 shown in FIG. 10.

The control circuit 22 includes an address determination circuit 22a, a signal generation circuit 22b and a dummy word line control circuit 22c. The address determination circuit 22a determines whether a test row address falls outside the address space stored in the storage circuit 12a. The circuit 22a also determines whether a test column address falls outside the address space.

The signal generation circuit 22b generates control signals T20 and T21 for controlling the memory macro MCR2 (specifically a cell array CA, a precharge circuit PC and a sense amplification circuit SA) based on the determination results of the address determination circuit 22a. The dummy word line control circuit 22c controls dummy word lines DWL1 and DWL2 descried later.

The memory macro MCR2 has a command conversion circuit 21. The command conversion circuit 21 converts a command in response to the control signals supplied from the test circuit 2. Then, the circuit 21 supplies the command to the memory macro MCR2 (specifically, the cell array CA, precharge circuit PC and sense amplification circuit SA).

The memory macro MCR2 has dummy word lines DWL1 and DWL2. For example, grounded dummy transistors DT1 and DT2 are connected to the dummy word lines DWL1 and DWL2. In other words, the gate of the transistor DT1 is connected to the dummy word line DWL1, and the source thereof is connected to the ground potential Vss. The drain of the transistor DT1 is connected to a bit line BL0.

The gate of the transistor DT2 is connected to the dummy word line DWL2, while the source thereof is connected to the ground potential Vss. The drain of the transistor DT2 is connected to a bit line/BL0. There are dummy transistors connected to another bit line pair. The configuration of these dummy transistors is the same as that of the dummy transistors DT1 and DT2 described above. The dummy word lines DWL1 and DWL2 are activated based on the control signals supplied from the test circuit 2.

The test circuit 2 and memory macro MCR2 are connected to each other by a control signal line 23. The control signals output from the test circuit 2 are sent to the memory macro MCR2 through the control signal line 23.

Figure 12:
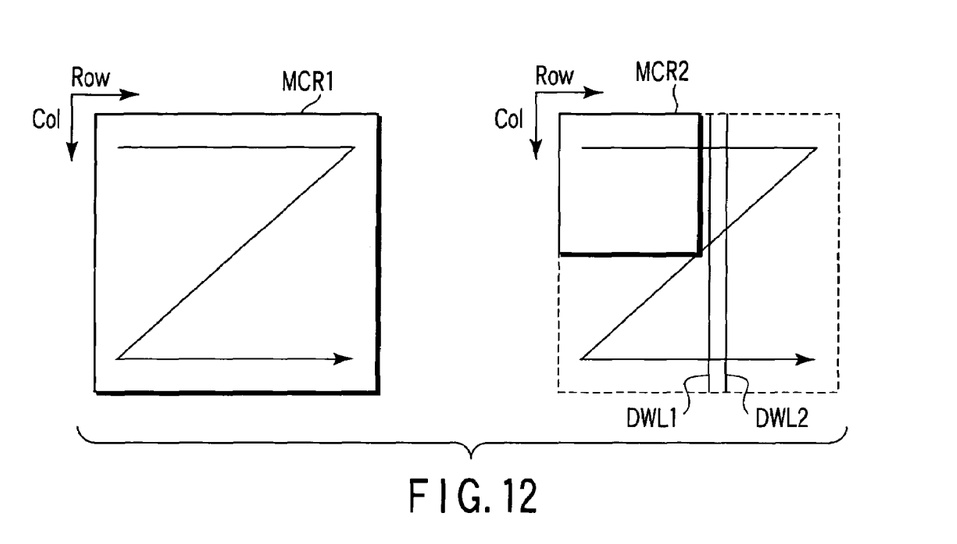
FIG. 12 is an illustration of row-first scan operations of the memory macros MCR1 and MCR2.
Figure 13:
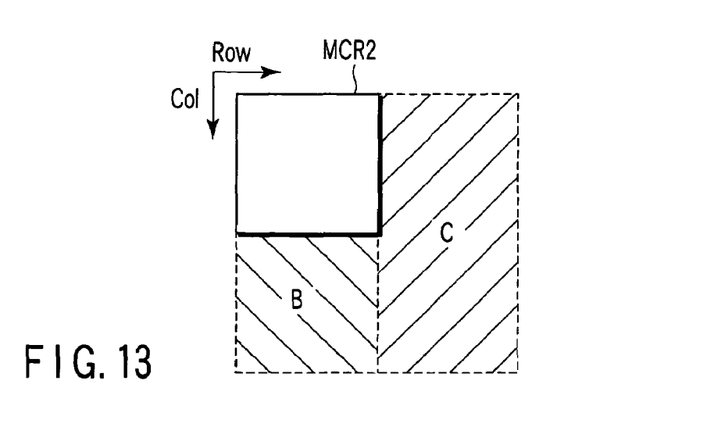
FIG. 13 is an illustration of an operation of the memory macro MCR2.

An operation of the semiconductor device 20 so configured will be described. First, an operation of the test circuit 2 in row-first scan mode will be discussed. FIG. 12 is an illustration of row-first scan operations performed for the memory macros MCR1 and MCR2 by the test circuit 2. FIG. 13 is an illustration of an operation performed for the memory macro MCR2 by the test circuit 2. In FIG. 12, the arrows indicate the direction of scanning.

The test circuit 2 conducts the same test on the memory macros MCR1 and MCR2 at the same time. The test circuit 2 sends the same address and the same command to the memory macros MCR1 and MCR2.

Referring to FIG. 13, when the test circuit 2 addresses the address space of the memory macro MCR2, the control circuit 22 causes the memory macro MCR2 to execute the command sent from the test circuit 2. In other words, the control circuit 22 does not convert the command sent from the test circuit 2.

While the test circuit 2 is addressing an area C (in which the test row address falls outside the address space), the control circuit 22 activates the dummy word line DWL1 or DWL2. Thus, the same electrical stress on the bit lines of the memory macro MCR1 is applied to those of the memory macro MCR2. During the addressing of the area C, all the commands output from the test circuit 2 can be inactivated. A user can freely determine whether to activate the dummy word lines or inactivate all the commands during the address of the area C.

While the test circuit 2 is addressing an area B (in which the test row address does not fall outside the address space but the test column address falls outside the address space), the control circuit 22 refreshes data stored in the memory cells corresponding to the area B. In other words, the control circuit 22 supplies the memory macro MCR2 with the command BA/BP output from the test circuit 2 and inactivates the command WT/RD. Thus, the control circuit 22 refreshes the data stored in the memory cells connected to a selected word line.

Figure 14:
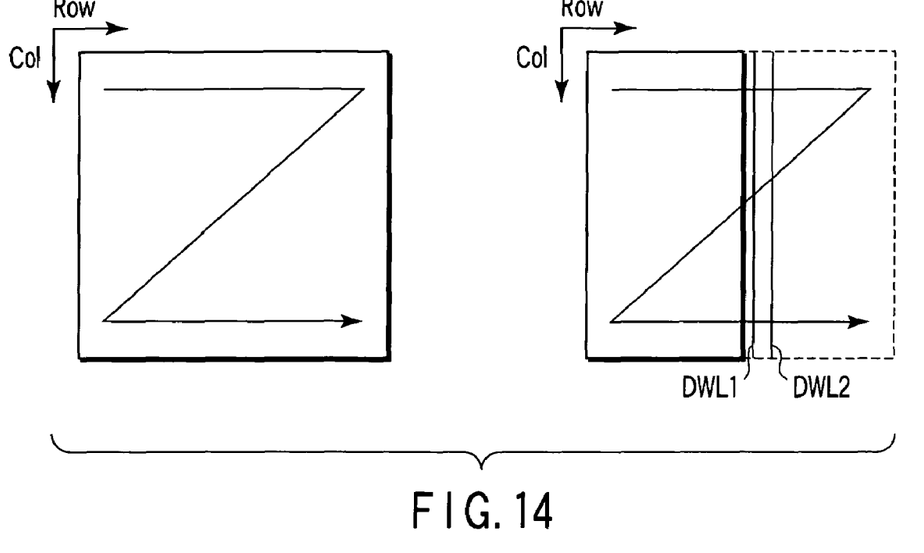
FIG. 14 is an illustration of row-first scan operations of the memory macros MCR1 and when the size of the memory macro MCR2 is smaller than that of the memory macro MCR1 in the row direction.

FIG. 14 is an illustration of the row-first scan operations performed when the size of the memory macro MCR2 in the column direction is the same as that of the memory macro MCR1 and the size of the memory macro MCR2 in the row direction is smaller than that of the memory macro MCR1. If the addressing in the row direction is performed outside the memory macro MCR2, the control circuit 22 activates the dummy word line DWL1 or DWL2. If the memory macro MCR2 is so configured, the same electrical stress on the bit lines of the memory macro MCR1 can be applied to the all of bit lines of the memory macro MCR2.

Figure 15:
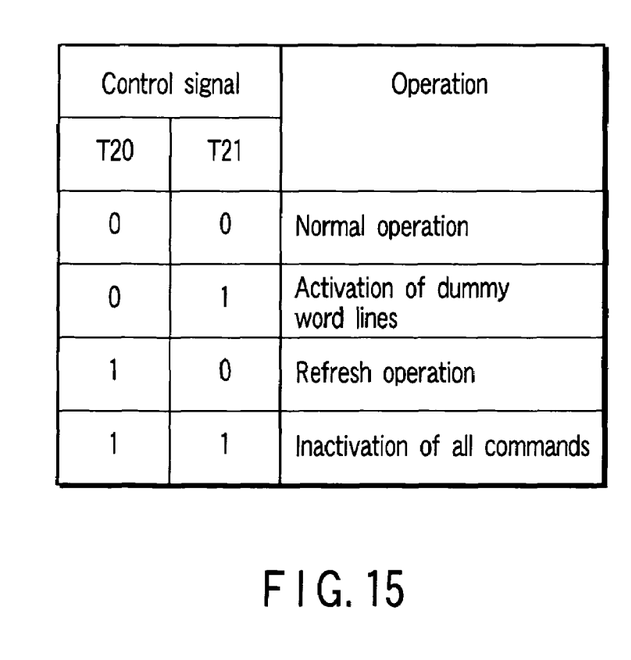
FIG. 15 is a table of control signals generated by the control circuit 22 shown in FIG. 11.

FIG. 15 is a table of control signals generated by the control circuit 22 of the test circuit 2. The control circuit 22 controls the memory macro MCR2 by two control signals T20 and T21.

Referring to FIG. 15, when T20 and T21 are both 0, the memory macro MCR2 performs a normal operation (or it executes the command sent from the test circuit as it is). When T20 is 0 and T21 is 1, the memory macro MCR2 activates the dummy word line DWL1 or DWL2. When T20 is 1 and T21 is 0, the memory macro MCR2 performs a refresh operation. When T20 and T21 are both 1, the memory macro MCR2 inactivates all the commands.

Figure 16:
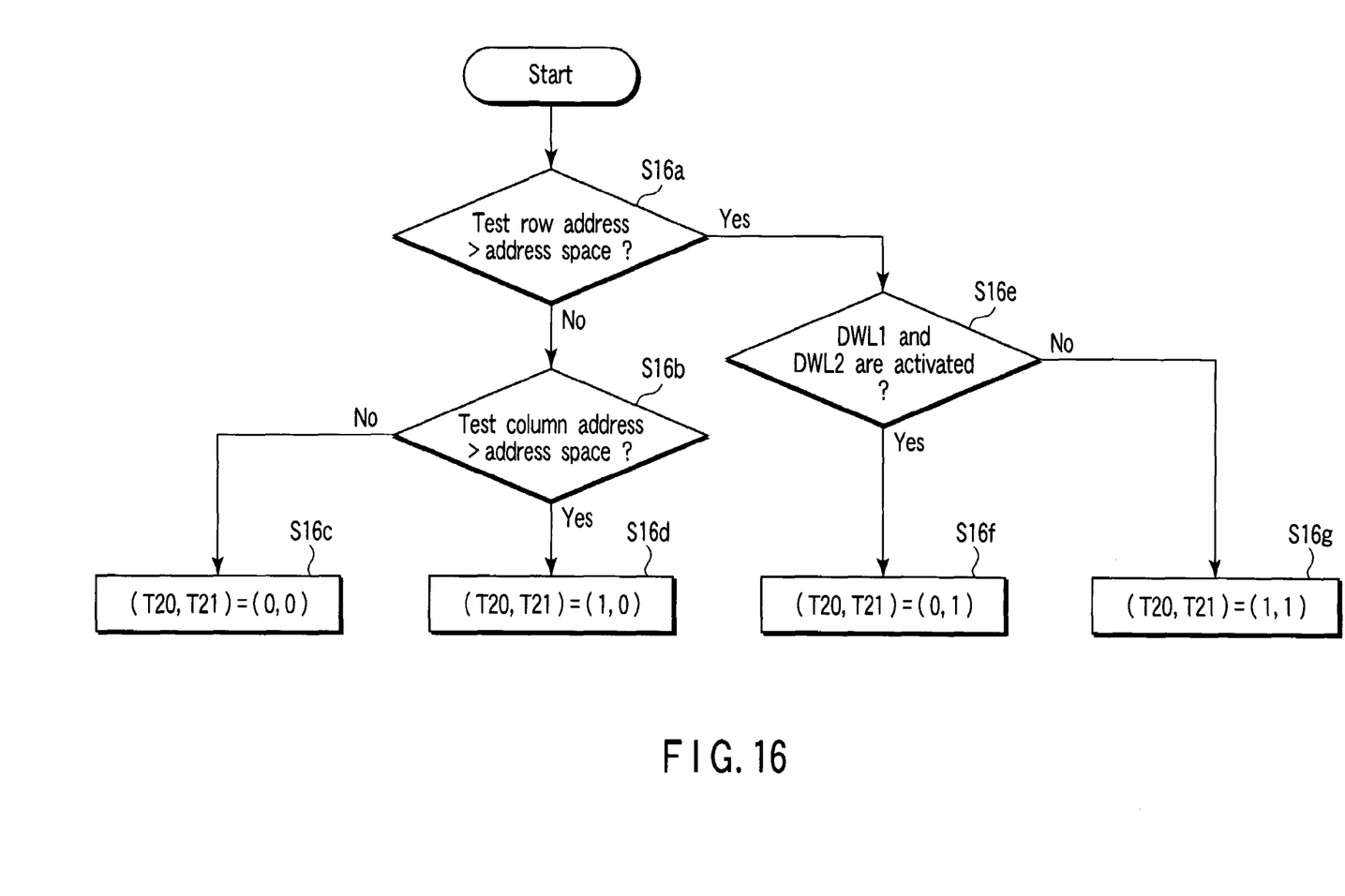
FIG. 16 is a flowchart showing an operation of the control circuit 22 shown in FIG. 11 in row-first scan mode.

FIG. 16 is a flowchart showing an operation of the control circuit 22 of the test circuit 2 in row-first scan mode. The test circuit 2 also sends a command to be executed for testing the memory macro MCR1 to the memory macro MCR2.

First, the address determination circuit 22a compares a test row address with the address space stored in the storage circuit 12a (step S16a). If the circuit 22a determines that the test row address falls outside the address space, it compares a test column address with the address space (step S16b).

If the circuit 22a determines that the test column address does not fall outside the address space in step S16b, the signal generation circuit 22b outputs control signals T20 (=0) and T21 (=0) (step S16a). If the circuit 22a determines that the test column address falls outside the address space in step S16b, the circuit 22b outputs control signals T20 (=1) and T21 (=0) (step S16d).

If the circuit 22a determines that the test row address falls outside the address space in step S16a, the dummy word line control circuit 22c determines whether to active one of the dummy word lines DWL1 and DWL2 (step S16e). When one of the dummy word lines is activated, the signal generation circuit 22b outputs control signals T20 (=0) and T21 (=1) (step S16f). When it is not activated, the circuit 22b outputs control signals T20 (=1) and T21 (=1) (step S16g).

The control circuit 22 performs the above operations each time the test column address is incremented.

Figure 17:
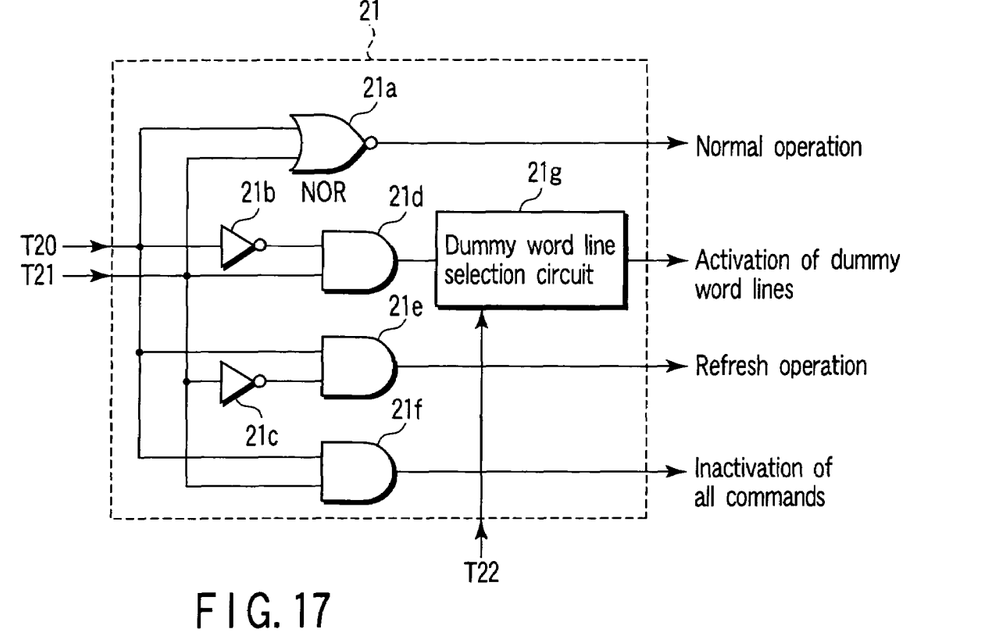
FIG. 17 is a circuit block diagram showing an arrangement of a command conversion circuit 21 in the memory macro MCR2.

A configuration of the command conversion circuit 21 of the memory macro MCR2 will be described. FIG. 17 is a circuit block diagram of the configuration of the command conversion circuit 21.

As shown in FIG. 17, the command conversion circuit 21 includes a NOR circuit 21a, inverter circuits 21b and 21c, and AND circuits 21d, 21e and 21f. The control signal T20 is supplied to the input sections of the NOR circuit 21a and AND circuits 21e and 21f. The control signal T20 is supplied to the AND circuit 21d through the inverter circuit 21b.

The control signal T21 is supplied to the input sections of the NOR circuit 21a and AND circuits 21d and 21f. The control signal T21 is supplied to the AND circuit 21e through the inverter circuit 21c.

The NOR circuit 21a outputs a command for performing a normal operation by the memory macro MCR2. The AND circuit 21e outputs a command for performing a refresh operation by the memory macro MCR2. The AND circuit 21f outputs a command for inactivating a command supplied from the test circuit 2.

The command conversion circuit 21 includes a dummy word line selection circuit 21g. The dummy word line selection circuit 21g is supplied with an output signal of the AND circuit 21d. The circuit 21g is also supplied with a control signal T22 from the dummy word line control circuit 22c.

The dummy word line selection circuit 21g activates one of the dummy word lines DWL1 and DWL2 based on the control signal T22. It is thus possible to have a difference in potential between paired bit lines of the memory macro MCR2.

As described above, the dummy word line control circuit 22c generates the control signal T22 for selecting a dummy word line to be activated. A given dummy word line can be selected to be activated, or a dummy word line can be selected such that a difference in potential between paired bit lines of the memory macro MCR2 becomes equal to a difference in potential between those of the corresponding memory macro MCR1.

Figure 18:
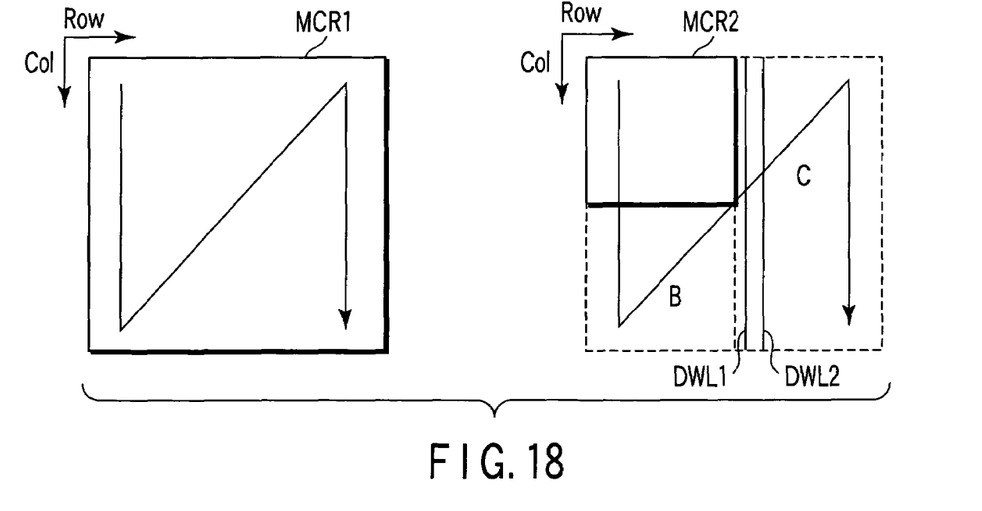
FIG. 18 is an illustration of an operation of the memory macro MCR2.

Next, an operation of the test circuit 2 in column-first scan mode will be described. FIG. 18 is an illustration of the operation of the test circuit 2. The arrows in FIG. 18 indicate the direction of scanning.

Referring to FIG. 18, while the test circuit 2 is addressing an area B, the data stored in memory cells of the area B is refreshed. While the test circuit 2 is addressing an area C, the dummy word line DWL1 or DWL2 is activated. Thus, the same electrical stress on the bit lines of the memory macro MCR1 is applied to those of the memory macro MCR2.

Figure 19:
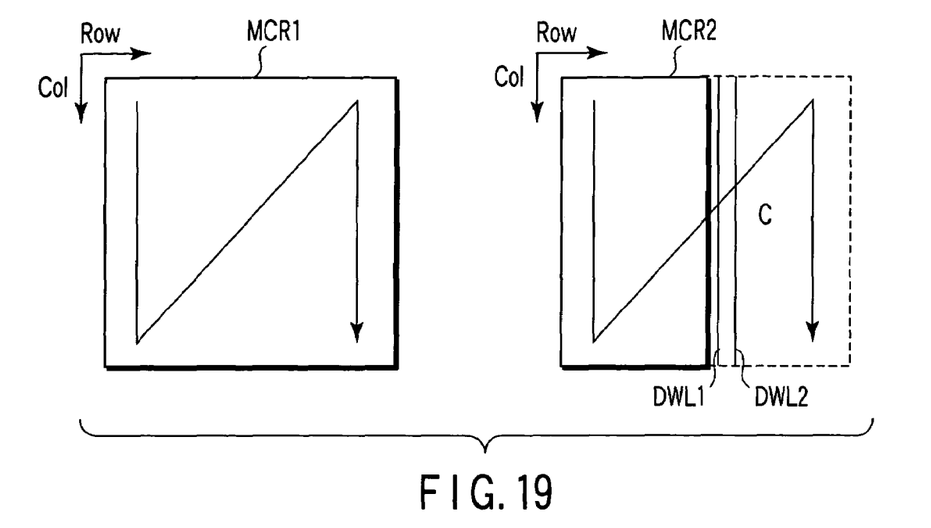
FIG. 19 is an illustration of an operation of the test circuit for the memory macro MCR2 when the size of the second memory macro is smaller than that of the memory macro MCR1 in the row direction.

FIG. 19 is an illustration of the column-first scan operations performed when the size of the memory macro MCR2 in the column direction is the same as that of the memory macro MCR1 and the size of the memory macro MCR2 in the row direction is smaller than that of the memory macro MCR1. If the addressing in the row direction is performed outside the memory macro MCR2, the dummy word line DWL1 or DWL2 is activated. If the memory macro MCR2 is so configured, the same electrical stress on the bit lines of the memory macro MCR1 can be applied to all the bit lines of the memory macro MCR2.

Figure 20:
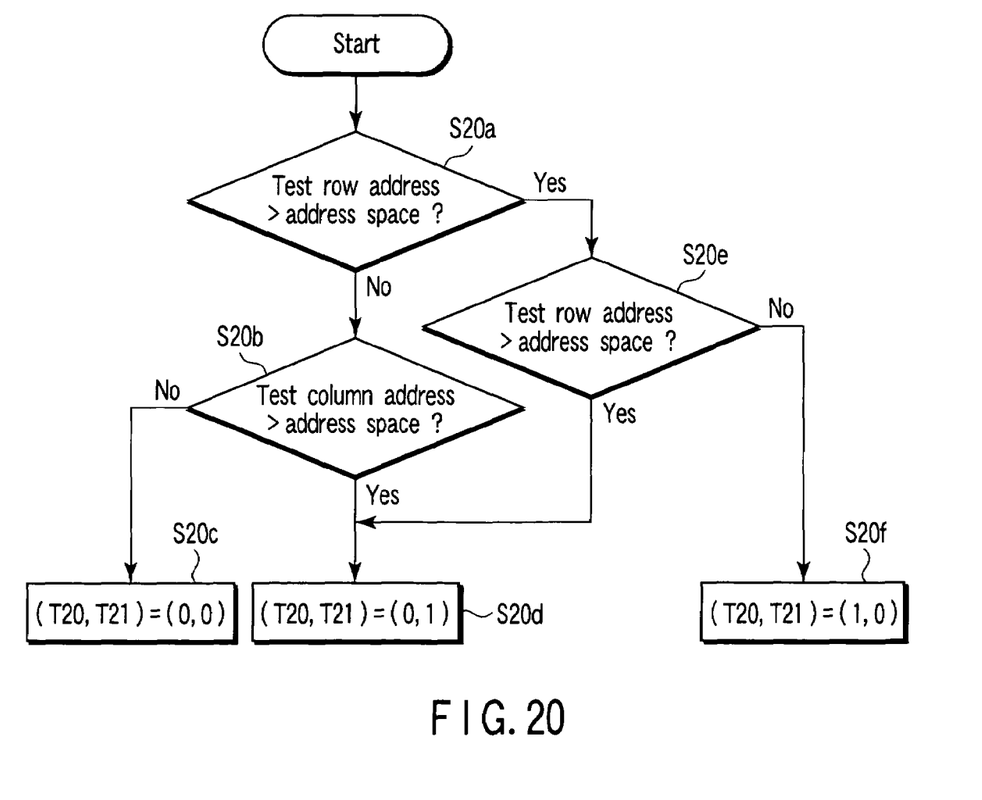
FIG. 20 is a flowchart showing an operation of the control circuit 22 in column-first scan mode.

FIG. 20 is a flowchart showing an operation of the control circuit 22 of the test circuit 2 in column-first scan mode. The test circuit 2 also sends a command to be executed for testing the memory macro MCR1 to the memory macro MCR2.

First, the address determination circuit 22a compares a test column address with the address space stored in the storage circuit 12a (step S20a). If the circuit 22a determines that the test column address does not fall outside the address space, it compares a test row address with the address space (step S20b).

If the circuit 22a determines that the test row address does not fall outside the address space in step S20b, the signal generation circuit 22b outputs control signals T20 (=0) and T21 (=0) (step S20c). If the circuit 22a determines that the test row address falls outside than the address space in step S20b, the circuit 22b outputs control signals T20 (=0) and T21 (=1) (step S20d).

If the circuit 22a determines that the test column address falls outside the address space in step S20a, it compares the test row address with the address space stored in the storage circuit 12a (step S20e). If the circuit 22a determines that the test row address falls outside the address space in step S20e, the signal generation circuit 22b outputs control signals T20 (=0) and T21 (=1). If the circuit 22a determines that the test row address does not fall outside the address space in step S20e, the signal generation circuit 22b outputs control signals T20 (=1) and T21 (=0).

Consequently, the memory macro MCR2 can perform any one of a normal operation, a refresh operation, and an operation of activating a dummy word line.

According to the third embodiment, as described in detail above, the commands can be controlled in accordance with the size of each of the memory macros. A memory macro having a large row/column configuration and a memory macro having a small row/column configuration can thus be tested at the same time.

Even though the memory macro MCR1 is scanned and the memory macro MCR2 is not scanned, the same electrical stress as that on the memory macro MCR1 can be applied to the bit lines of each of the memory macros. In other words, the memory macro MCR2 can be tested under the same conditions as those for the memory macro MCR1. During the test, the same compensation as that for the memory macro MCR1 can be provided for the memory macro MCR2.

The same potential difference as that between the paired bit lines of the memory macro MCR1 can be given to those of the memory macro MCR2. Electrical stress can thus be given to the memory macro MCR2 more exactly.

In the third embodiment, the memory macro MCR2 may have the storage circuit 12a and control circuit 22 of the test circuit 2. In other words, the third embodiment can be configured like the first embodiment. With this configuration, too, the same advantages can be obtained.

In the first to third embodiments described above, a DRAM is used as a memory cell. The present invention is not limited to the DRAM, but can be applied to other memories such as an SRAM.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first memory block including a plurality of first memory cells, a plurality of first bit line pairs connected to the first memory cells, and a plurality of first word lines connected to the first memory cells, the first memory block having a first address space;

a second memory block including a plurality of second memory cells, a plurality of second bit line pairs connected to the second memory cells, and a plurality of second word lines connected to the second memory cells, the second memory block having a second address space which is smaller than the first address space;

a plurality of first dummy transistors connected in series between one bit line of each of the second bit line pairs and a ground potential;

a plurality of second dummy transistors connected in series between another bit line of each of the second bit line pairs and the ground potential;

a first dummy word line connected to a gate electrode of each of the first dummy transistors;

a second dummy word line connected to a gate electrode of each of the second dummy transistors; and a test circuit supplies a test address and a test control signal to the first memory block and the second memory block, and tests the first memory block and the second memory block simultaneously, the test address including a first test address to select the first bit line pairs and the second bit line pairs and a second test address to select the first word lines and the second word lines, wherein the second memory block includes:

a storage circuit which stores an address corresponding to the second address space; and a control circuit which activates one of the first dummy word line and the second dummy word line when the second test address falls outside the second address space.

2. The semiconductor device according to claim 1, wherein the control circuit rewrites data stored in the second memory cells when the first test address falls outside the second address space and the second test address does not fall outside the second address space.

3. The semiconductor device according to claim 2, wherein the second memory block includes a precharge circuit which charges the second bit lines with a given potential and a sense amplification circuit which amplifies data transferred to the second bit lines, and the control circuit charges the second bit lines with the given potential and activates word lines corresponding to the second test address when the first test address falls outside the second address space and the second test address does not fall outside the second address space.

4. The semiconductor device according to claim 1, wherein the control circuit includes a selection circuit which selects one of the first dummy word line and the second dummy word line to be activated.

5. The semiconductor device according to claim 1, wherein the first memory cells and the second memory cells are DRAM cells.

* * * * *